(12) United States Patent
Fetzer et al.

(10) Patent No.: US 9,915,704 B2
(45) Date of Patent: Mar. 13, 2018

(54) METHOD AND CIRCUIT ARRANGEMENT FOR DETERMINING THE COULOMBIC EFFICIENCY OF BATTERY MODULES

(71) Applicants: Robert Bosch GmbH, Stuttgart (DE); Samsung SDI Co., Ltd., Yongin-si, Gyeonggi-do (KR)

(72) Inventors: Joachim Fetzer, Bad-Ditzenbach (DE); Holger Fink, Stuttgart (DE); Hans Partes, Asperg (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/114,797

(22) PCT Filed: Jan. 23, 2015

(86) PCT No.: PCT/EP2015/051381
§ 371 (c)(1),
(2) Date: Jul. 27, 2016

(87) PCT Pub. No.: WO2015/110592
PCT Pub. Date: Jul. 30, 2015

(65) Prior Publication Data
US 2016/0341798 A1 Nov. 24, 2016

(30) Foreign Application Priority Data

Jan. 27, 2014 (DE) .................. 10 2014 201 365

(51) Int. Cl.
*G01R 31/36* (2006.01)
*B60L 11/18* (2006.01)
*H02J 7/00* (2006.01)

(52) U.S. Cl.
CPC ...... *G01R 31/3627* (2013.01); *B60L 11/1853* (2013.01); *G01R 31/3658* (2013.01);
(Continued)

(58) Field of Classification Search
CPC ............ G01R 31/3627; G01R 31/3658; B60L 11/1853; H02J 7/007; H02J 2007/0067
(Continued)

(56) References Cited

U.S. PATENT DOCUMENTS 5,642,275 A * 6/1997 Peng .................. H02M 7/49
363/137
6,329,792 B1 * 12/2001 Dunn ................. G01R 31/3658
320/130

(Continued)

FOREIGN PATENT DOCUMENTS

DE   10 2011 004 248 A1   8/2011
DE   10 2011 075 421 A1   11/2012

(Continued)

OTHER PUBLICATIONS

Sattar, Abdus, "MOSFETs Withstand Stess of Linear-Mode Operation", Apr. 2007, Power Electronics Technology, p. 34.*

(Continued)

*Primary Examiner* — Patrick Assouad
*Assistant Examiner* — Khristopher Yodichkas
(74) *Attorney, Agent, or Firm* — Maginot, Moore & Beck LLP

(57) ABSTRACT

The disclosure relates to a method for determining a Coulombic efficiency of battery modules of a rechargeable battery with a circuit arrangement connected to the battery modules. The circuit arrangement has multiple current paths, each of which has a series circuit of switch modules and at least one power semiconductor element which can be operated in a linear mode in order to regulate the current flowing (Continued)

through the respective current path, and one of the battery modules is connected to each of the switch modules. Each of the switch modules is configured as a switch module for selectively connecting the connected battery module into the respective current path or to alternatively remove the connected battery module from the respective current path. In each of the current paths at least one of the battery modules is selected with the switch module.

8 Claims, 4 Drawing Sheets

(52) U.S. Cl.
CPC ...... *G01R 31/3637* (2013.01); *G01R 31/3679* (2013.01); *H02J 7/007* (2013.01); *H02J 7/0021* (2013.01); *H02J 7/0047* (2013.01); *H02J 2007/005* (2013.01); *H02J 2007/0067* (2013.01)

(58) Field of Classification Search
USPC .................................. 324/426; 320/116–122
See application file for complete search history.

(56) References Cited

U.S. PATENT DOCUMENTS

| | | | | |
|---|---|---|---|---|
| 8,288,992 | B2* | 10/2012 | Kramer | H02J 7/0016 320/117 |
| 2010/0121511 | A1* | 5/2010 | Onnerud | B60L 11/1851 701/22 |
| 2010/0157495 | A1 | 6/2010 | Densham | |
| 2010/0261048 | A1 | 10/2010 | Kim et al. | |
| 2011/0028258 | A1* | 2/2011 | Sano | F16G 5/16 474/265 |
| 2011/0198936 | A1 | 8/2011 | Graovac | |
| 2011/0286137 | A1* | 11/2011 | Bosch | B60L 3/04 361/78 |
| 2012/0046892 | A1* | 2/2012 | Fink | G01R 31/3658 702/63 |
| 2013/0019508 | A1* | 1/2013 | Smith | A43B 1/00 36/72 R |
| 2013/0187473 | A1* | 7/2013 | Deboy | H02M 7/49 307/82 |
| 2013/0332017 | A1* | 12/2013 | Hisano | B60W 20/106 701/22 |
| 2016/0211767 | A1* | 7/2016 | Hotta | H02M 1/08 |
| 2016/0336623 | A1* | 11/2016 | Nayar | H01M 4/38 |

FOREIGN PATENT DOCUMENTS

| | | | |
|---|---|---|---|
| DE | 10 2011 089 312 A1 | 6/2013 | |
| DE | 10 2012 209 660 A1 | 12/2013 | |
| DE | 10 2012 210 602 A1 | 12/2013 | |
| JP | 2005198406 A * | 7/2005 | ............ B60L 11/123 |
| WO | 99/01918 A2 | 1/1999 | |
| WO | WO 2011128135 A1 * | 10/2011 | .......... H01M 10/482 |

OTHER PUBLICATIONS

International Search Report corresponding to PCT Application No. PCT/EP2015/051381, dated Apr. 1, 2015 (German and English language document) (7 pages).

Smith et al.; Precision Measurements of the Coulombic Efficiency of Lithium-Ion Batteries and of Electrode Materials for Lithium-Ion Batteries; Journal of the Electrochemical Society; 2010; pp. A196-A202; vol. 157, Issue No. 2; The Electrochemical Society.

Kennedy et al.; Use of lithium-ion batteries in electric vehicles; Journal of Power Sources; Feb. 16, 2000; pp. 156-162; vol. 90; Elsevier Science.

\* cited by examiner

METHOD AND CIRCUIT ARRANGEMENT FOR DETERMINING THE COULOMBIC EFFICIENCY OF BATTERY MODULES

This application is a 35 U.S.C. § 371 National Stage Application of PCT/EP2015/051381, filed on Jan. 23, 2015, which claims the benefit of priority to Serial No. DE 10 2014 201 365.8, filed on Jan. 27, 2014 in Germany, the disclosures of which are incorporated herein by reference in their entirety.

The disclosure relates to a method and a circuit arrangement for determining the Coulombic efficiency of battery modules of a rechargeable battery.

BACKGROUND

Vehicles having an electric or hybrid drive need rechargeable batteries (traction batteries), which generally have a modular structure, to operate their electrical drive machine. In many applications, such rechargeable batteries are differently also referred to as storage batteries. In order to now supply the electrical drive machine of the electric or hybrid drive with electrical energy from the batteries, a circuit arrangement is interposed between the battery modules and the drive machine.

The rechargeable batteries, usually based on lithium, used in electrically driven vehicles have only a limited service life on account of parasitic chemical processes in their interior. Their capacity is reduced with each charging/discharging cycle until the individual battery cells or the battery modules consisting of such cells have to be replaced owing to a lack of performance and capacity. Therefore, it is important to accurately observe the ageing process of the battery cells or battery modules. Various methods and apparatuses for monitoring the ageing state are known from the prior art.

The scientific article "Smith, A. J. et al., J. Electrochem. Soc. 157, A196 (2010)" describes a method which can be used to infer changes in the ageing state (change in the SOH: State of Health) of lithium ion battery cells from the so-called Coulombic efficiency. However, a corresponding additional power electronic measuring and regulating device is needed to carry out such a method.

The method according to the disclosure provides the advantage that no additional power electronics are required.

In the method according to the disclosure for determining the Coulombic efficiency $C_E$ of battery modules of a rechargeable battery, provision is made for the Coulombic efficiency to be determined by means of a circuit arrangement connected to the battery modules. This circuit arrangement has a plurality of current paths each in turn having a series circuit of switching modules and at least one power semiconductor element which can be operated in the linear mode and is intended to regulate the current flowing through the respective current path. One battery module is connected to each of the switching modules, and each of the switching modules is in the form of a switching module for selectively connecting the connected battery module in the respective current path (charging or discharging mode) or for alternatively removing the connected battery module from this respective current path (bypass mode). In this case, in each of the current paths, (i) at least one of the battery modules is selected and is connected in the respective current path by means of the switching modules, while all other battery modules are removed from this current path by means of the switching modules, and (ii) the selected battery module is subjected to at least one discharging process and at least one charging process via the respective current path, the corresponding current being accurately set during charging and discharging of this battery module in this current path by means of the power semiconductor element which is operated in the linear mode, and the corresponding charge quantities $Q_{ab}$, $Q_{zu}$ during charging and discharging or variables proportional to these charge quantities being determined by integrating the current over time. The Coulombic efficiency $C_E$ defined as $$C_E = \frac{Q_{ab}}{Q_{zu}}$$

can then be determined from the charge quantities $Q_{ab}$, $Q_{zu}$ or variables proportional to the latter. In the simplest case, each of the battery modules consists of an individual battery cell. Alternatively, each of the battery modules consists of a series circuit of a plurality of battery cells.

The circuit arrangement is interposed between the battery modules of the rechargeable battery and a consumer to be supplied by the battery or batteries, each battery module being connected to a switching module of the circuit arrangement. During normal operation, the switching modules are used to select individual battery modules for this voltage supply and to connect them to one another in a current path. Such a circuit arrangement is known as a battery direct converter. The battery direct converter can be or is interposed directly, that is to say without further intermediate elements, between the battery modules, on the one hand, and the electrical consumer to be supplied by the battery modules.

The essence of the disclosure is to control a power semiconductor element in the respective current path of the circuit arrangement in such a manner that said element is at least sometimes in the linear mode and the current through the battery cells of the corresponding battery module is regulated very accurately with the aid of this linearly operated power semiconductor element in accordance with current regulation in the charger. A power semiconductor element which can be operated in this manner is generally present in battery direct converters anyway. Therefore, the very accurate setting of the charging or discharging current, which is needed to determine the Coulombic efficiency $C_E$, can be easily implemented without additional power electronics. Only the control of said power semiconductor element would have to be supplemented in order to carry out the method according to the disclosure. However, such control can manage without power electronic components.

The consumer to be supplied by the battery modules is preferably a multiphase electrical consumer, in particular a multiphase electrical machine. In this case, the battery direct converter is a multiphase direct converter which can be interposed directly between the battery modules of the batteries, on the one hand, and the multiphase electrical consumer to be supplied by the battery modules. In this case, the battery modules can be connected in a number of current paths corresponding to the number of phases.

According to one advantageous development of the disclosure, one of the power semiconductor elements of the switching modules forms the power semiconductor element for regulating the current flowing through the respective current path. In this embodiment, the power semiconductor elements of the switching modules are controlled by means of a control device and are operated in the linear mode in order to set the electrical current during the charging process and the discharging process.

One advantageous embodiment of the disclosure provides for each of the switching modules to have a bridge circuit arrangement with two half-bridges, two power semiconductor elements which act as semiconductor current valves and two freewheeling diodes being connected in each of these half-bridges. Therefore, a bridge circuit arrangement in the form of a full bridge results overall for each switching module. In this case, one of the two semiconductor current valves is (reverse) connected in parallel with one of the two freewheeling diodes for each half-bridge. The two parallel circuits with the one semiconductor current valve and the one freewheeling diode each are connected in a series circuit, thus producing the respective half-bridge. These series circuits of the bridge circuit arrangements are connected to the connected battery module. Such switching modules are known from direct converters, for example, and are used there for so-called "cell balancing", the equalization of the state of charge between the individual battery cells or battery modules. For this purpose, the battery cells or battery modules are preferably connected, by means of the switching modules, in the current path whose state of charge is relatively high. The main task of the switching modules in direct converters is admittedly to set the voltage at the consumer, that is to say to provide a three-phase voltage system, for example. Strictly speaking, current is generally regulated in the machine in this case and the voltage is set using the switching modules such that the desired nominal current value is produced.

According to another advantageous development of the disclosure, the circuit arrangement is in the form of a circuit arrangement for electrically supplying the multiphase electrical consumer, in particular the multiphase electrical machine. In this case, the number of current paths corresponds to the number of phases. In this case, the electrical supply for each of the phases is effected via a permanently assigned current path in each case. The number of phases or current paths is preferably three or six.

According to one advantageous configuration of the disclosure, the selected battery module is discharged via an external electrical component connected to the circuit arrangement. This component is the electrical consumer, in particular.

According to another advantageous configuration of the disclosure, the selected battery module is discharged via a connectable (load) resistor of the circuit arrangement itself. In this case, provision is made, in particular, for the connectable resistor to be selectively connected or disconnected by means of a controllable contactor.

According to another advantageous development of the disclosure, the selected battery module is charged via a charger connected to the respective current path.

The invention also relates to a corresponding circuit arrangement for determining the Coulombic efficiency of battery modules of a rechargeable battery. This circuit arrangement has a plurality of current paths each in turn having a series circuit of switching modules and at least one power semiconductor element which can be operated in the linear mode and is intended to regulate the current flowing through the respective current path. One battery module is connected to each of the switching modules, and each of the switching modules is in the form of a switching module for selectively connecting the connected battery module in the respective current path (charging or discharging mode) or for alternatively removing the connected battery module from this respective current path (bypass mode). The circuit arrangement is set up to subject the selected battery module to at least one discharging process and at least one charging process via the respective current path, the corresponding current in this current path being able to be accurately set during charging and discharging of this battery module by means of the power semiconductor element which is operated in the linear mode, and the circuit arrangement having means for determining the corresponding charge quantities by integrating the current over time during the charging process and the discharging process. The circuit arrangement also comprises a control device for controlling the respective power semiconductor element in the linear mode in order to set the electrical current during the charging process and the discharging process. In this case, either a central control device is provided or alternatively a separate control device is provided for each individual power semiconductor element. The selected battery module is discharged via an external electrical component or via a connectable load resistor of the circuit arrangement itself. The selected battery module is charged via an external charger connected to the respective current path. Corresponding connections are provided for the external devices. The circuit device is, in particular, a circuit arrangement for carrying out the method mentioned at the outset.

BRIEF DESCRIPTION OF THE DRAWINGS

The disclosure is explained in more detail below using figures, in which.

DETAILED DESCRIPTION

Figure 1:
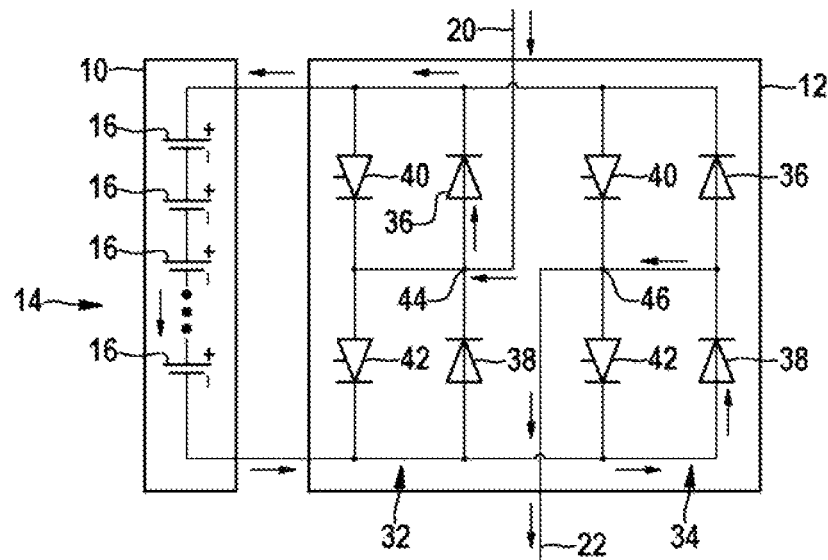
FIG. 1 shows a unit consisting of a battery module of a rechargeable battery and a switching module of a circuit arrangement for determining the Coulombic efficiency of the battery modules according to one preferred embodiment of the disclosure, a charging current for charging the battery module in a first current direction also being depicted.

FIG. 1 shows the circuit diagram of a unit 14 consisting of a battery module 10 of a rechargeable battery (a storage battery) of modular structure and a switching module 12. In this case, the battery module 10 consisting of a plurality of battery cells 16 is connected in the circuit module 12. The switching module 12 is one of a plurality of modules 12 of a circuit arrangement 18 of modular structure which is shown in its entirety in FIG. 5 and is intended to determine the Coulombic efficiency $C_E$ of the battery modules 10 connected in this circuit arrangement 18. This circuit arrangement 18 is substantially formed by a battery direct converter. The switching module 12 itself has two external connections 20, 22 which are used to connect it in one of a plurality of current paths 24, 26, 28 shown in FIG. 5. Overall, a plurality of switching modules 12 connected in series are provided for each current path 24, 26, 28, with the result that a multiplicity of such units 14 which always have the same structure result overall. Each of the switching modules 12 is used to selectively connect the battery module 10 connected therein in the associated current path 24, 26, 28 of the circuit arrangement 18 (charging or discharging mode) or to alternatively remove each individual battery module of the battery modules 10 from this current path 24, 26, (bypass mode). In this case, each of the current paths 24, 26, 28 is therefore a power current path of the circuit arrangement 18, via which the battery currents flow. In other words, the rechargeable battery is connected to an electrical consumer 30 (shown in FIG. 5) or to a charger (not shown) via the current paths 24, 26, 28.

The switching module 12 has a bridge circuit arrangement having two half-bridges 32, 34, two transistor-based power semiconductor elements 40, 42 acting as semiconductor current valves being connected in series in each of the half-bridges 32, 34 and being connected to a freewheeling diode 36, 38 reverse-connected in parallel in each case. A common center tap point 44 of the first bridge circuit arrangement 32 is connected in an electrically conductive manner to the first connection 20 of the switching module 12 and a common center tap point 46 of the second bridge circuit 34 is connected in an electrically conductive manner to the second connection 22 of the switching module 12. Control lines and measuring lines are not shown in the circuit diagram.

FIGS. 1 to 4 show the current course in the different operating modes of the switching modules 12. This current course is marked by arrows here.

The current in the unit 14 is controlled by accordingly switching the power semiconductor elements 40, 42 acting as semiconductor current valves. If all power semiconductor elements 40, 42 are turned off, the current can flow only in the direction shown in FIG. 1 (reverse mode) and the battery cells 16 of the connected battery module 10 are charged. The arrows indicate the direction of the current flow. The current flows via the connection 20 into the switching module 12 at the center tap point 44 of the first half-bridge 32, then flows via the freewheeling diode 36 of the first half-bridge 32 to the battery module 10, through its cells 16 to the freewheeling diode 38 of the second half-bridge 34, then to the center tap point 46 of the second half-bridge 34 and then out of the module 12 again via the connection 22. The battery module 10 is actually also charged via the switching module 12 if current is fed into the center tap point 46 of the second half-bridge 34 via the connection 22 and is removed at the center tap point 44 of the first half-bridge 32 and from the connection 20 (not shown).

Figure 2:
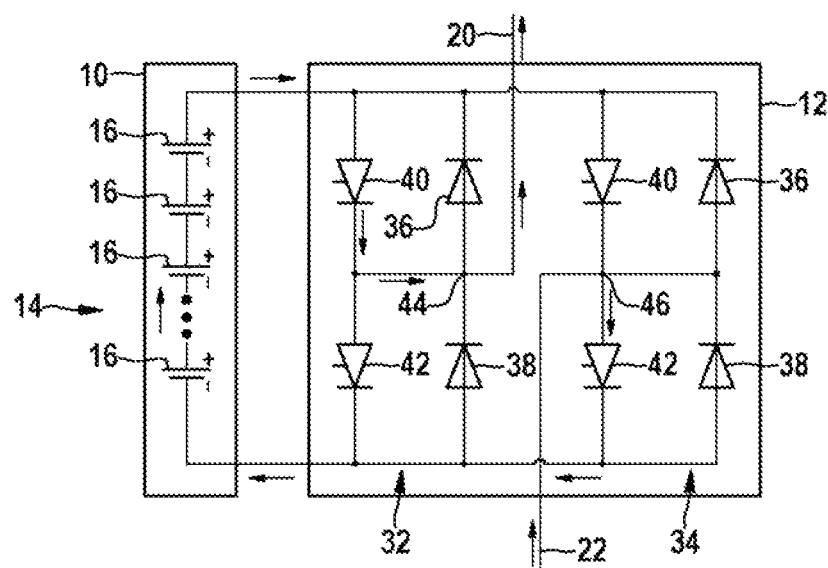
FIG. 2 shows the unit shown in FIG. 1, a discharging current for discharging the battery module in a second current direction being depicted.

The current flow in the discharging mode (normal operation) is shown in FIG. 2. The current flows into the switching module 12 via the connection 22 at the center tap point 46 of the second half-bridge 34, then through the power semiconductor element 42 of the second half-bridge 34 to the connected battery module 10, then through the cells 16 of the battery module 10 to the power semiconductor element 40 of the first half-bridge 32 and then out of the module 12 again via the center tap point 44 of the first half-bridge 32 and the connection 20.

Figure 3:
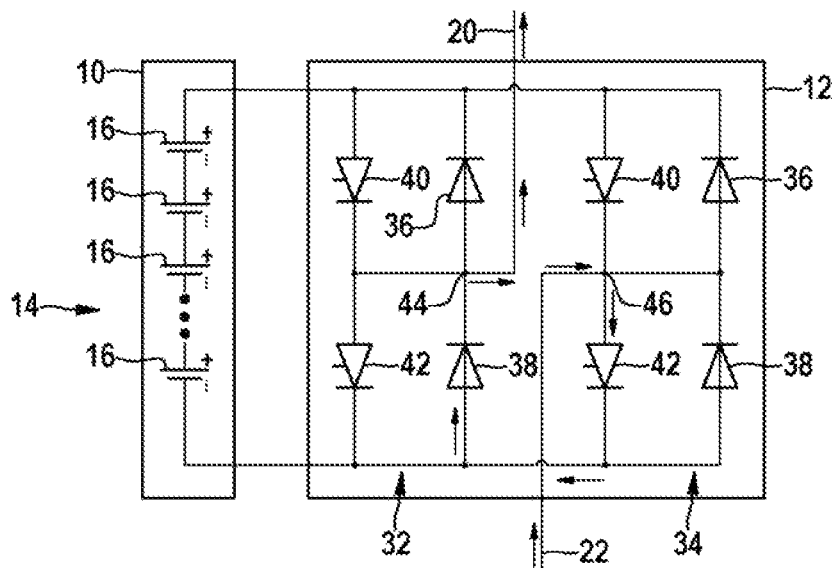
FIG. 3 shows the unit shown in FIG. 1, the switching module being in the bypass mode and a current flowing in the second current direction being depicted.
Figure 4:
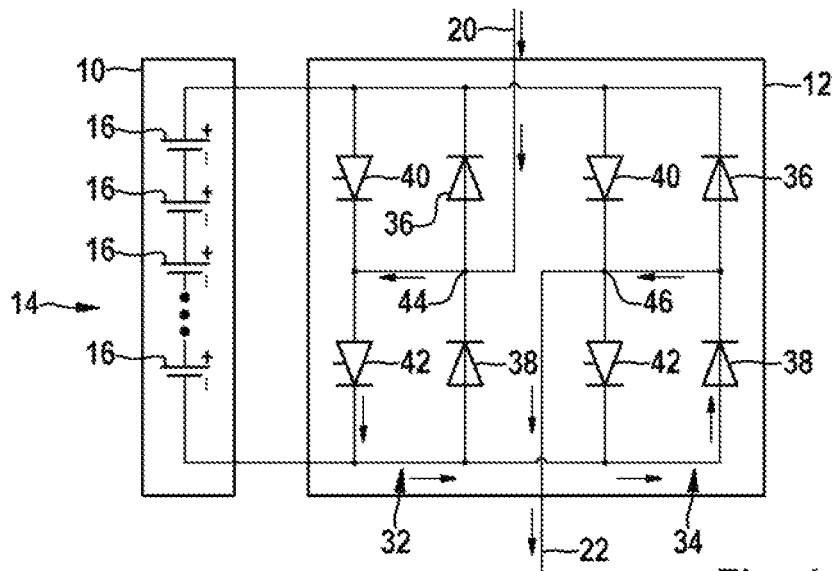
FIG. 4 shows the unit shown in FIG. 1, the switching module being in the bypass mode and a current flowing in the second current direction being depicted.

Since, in order to determine the Coulombic efficiency of a battery module 10, only this one battery module 10 is ever intended to be charged/discharged, the other battery modules 10 must be removed from the corresponding current path 24, 26, 28. If a battery module 10 of the corresponding current path 24, 26, 28 is therefore not intended to be discharged, the current is conducted past the cells 16 of the corresponding battery module 10 (bypass mode 1), as shown in FIG. 3. For this purpose, the power semiconductor element 42 of the second half-bridge 34 is turned on. The result is the current course from the connection 22 via the center tap point 46 and said power semiconductor element 42 of the second half-bridge 34 to the freewheeling diode 38 of the first half-bridge 32, then to the center tap point 44 of this half-bridge 32 and the connection 20. The current then passes from there out of the module 12 to the next module 12 of the current path 24, 26, 28 or to its end point.

The module 12 can also be changed in a similar manner during charging (with the opposite current direction). In this case, the power semiconductor element 42 of the first half-bridge 32 is turned on. The result is the current course shown in FIG. 4 from the connection 20 via the center tap point 44 and said power semiconductor element 42 of the first half-bridge 32 to the freewheeling diode 38 of the second half-bridge 34 and to the center tap point 46 of this half-bridge 34 and to the connection 22. The current passes from there out of the module 12 to the next module 12 of the current path 24, 26, 28 or to its other end point.

Figure 5:
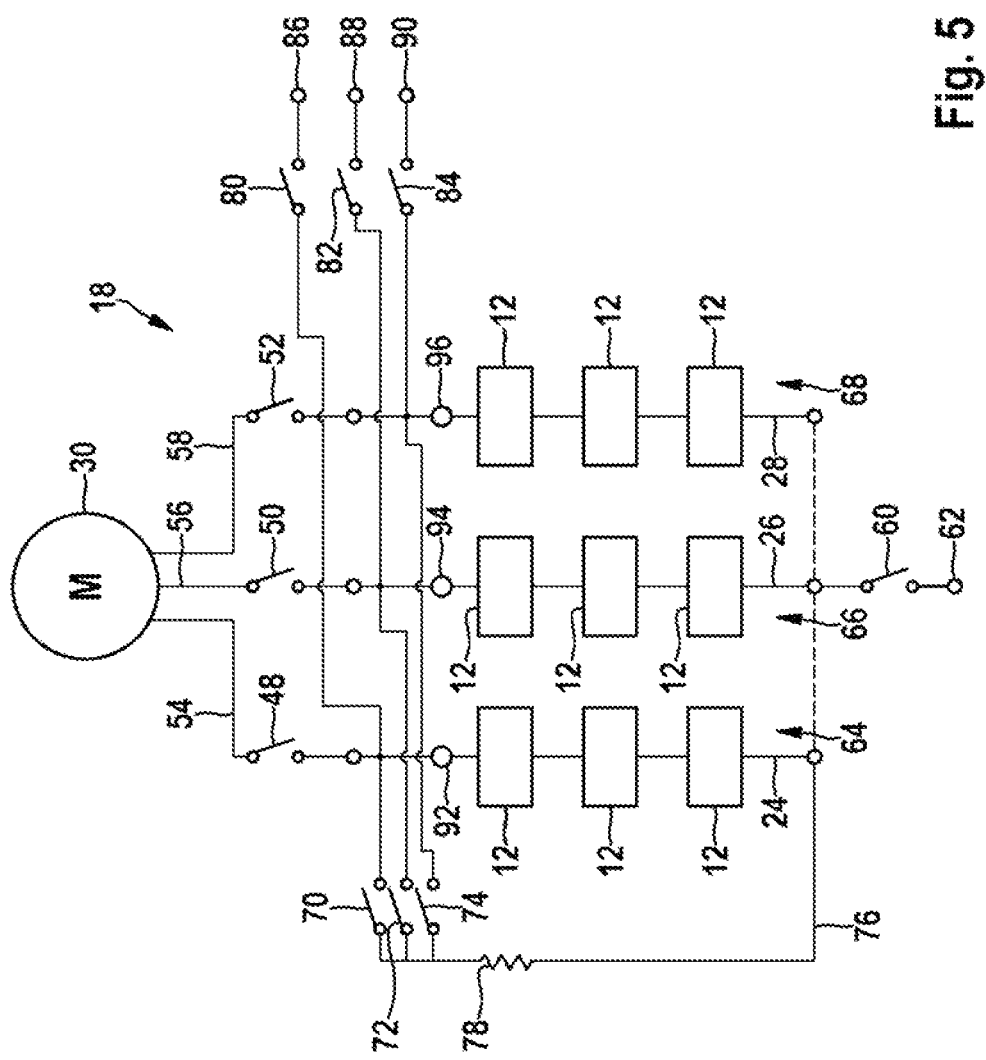
FIG. 5 shows the complete circuit arrangement with its plurality of current paths and an electrical machine connected to the circuit arrangement as the consumer.

FIG. 5 shows the complete circuit arrangement 18 with its plurality of (three in the example shown) current paths 24, 26, 28 and a three-phase electrical machine M connected to the circuit arrangement 18 as the consumer 30. In this case, each of the current paths 24, 26, 28 can be electrically connected to a respective phase connection 54, 56, 58 of one of the three phases of the electrical machine M via a respective main contactor 48, 50, 52. The battery modules 10 connected in one of the current paths 24, 26, 28 via the switching modules 12 are therefore responsible for electrically supplying the consumer with regard to the corresponding phase. Those ends of the current paths 24, 26, 28 which are opposite the switches 48, 50, 52 are connected to one another in an electrically conductive manner to form a star point and are connected to a connection 62 via a switch 60. The series circuit 64, 66, 68 of the switching modules 12 in each of the current paths 24, 26, 28 can be discharged via a bypass path 76 which can be connected by means of controllable contactors 70, 72, 74 and has a resistor 78 connected therein. Furthermore, each of the current paths can be connected to a respective further connection 86, 88, 90 via an associated further contactor 80, 82, 84. A current sensor 92, 94, 96 is connected in each of the current paths 24, 26, 28.

The three current paths 24, 26, 28 form a three-phase system. The consumers 30 or an HV vehicle network is/are connected via the main contactors 48, 50, 52.

The positive pole of a charger having three outputs is connected to one of the connections 86, 88, 90 via the corresponding charging contactors 80, 82, 84; the negative pole is connected to the connection 62 via the optional charging contactor 60. The flowing current is measured by means of the current sensors 92, 94, 96 (each switching module 12 additionally being able to contain a current sensor as well) and the voltages in the individual battery modules 10 connected in the switching modules 12 are measured by means of measuring chips (not shown).

Figure 6:
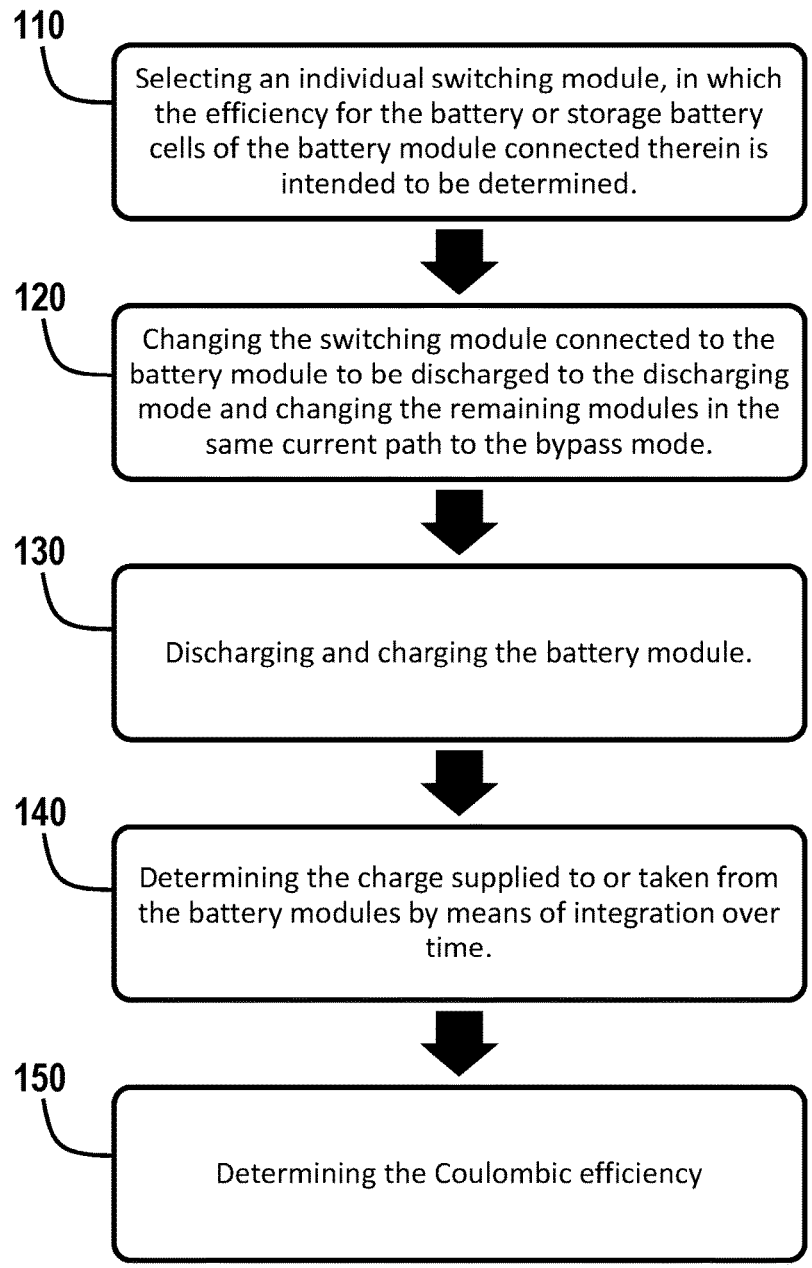
FIG. 6 shows a method for determining Coulombic efficiency

For the method 100, shown in FIG. 6, for determining the Coulombic efficiency $C_E$ of battery modules 10, an individual switching module 12, in which the efficiency for the battery or storage battery cells of the battery module 10 connected therein is intended to be determined, is selected (block 110). Without restricting generality, this is intended to be the switching module 12 at the very bottom in the current path 24 in FIG. 5 for the consideration below. The method is started when the rechargeable battery is in the quiescent state and is possibly connected to a 5 charger (for example charging of an electric vehicle overnight). There are two discharging possibilities: via the (load) resistor 78 or via the connected consumer 30.

A module 12 is discharged via the separate resistor 78 by means of the respective switching contactor 70, 72, 74. The modules 12 in the circuit arrangement 18 are now operated such that, during discharging of the battery modules 10, the selected switching module 12 is in the discharging mode and all other switching modules 12 are in the bypass mode (block 120). The contactor 70 is closed, with the result that the cells 16 of the battery module 10 can be discharged via the resistor 78 (block 130). The contactors 72, 74, 86, 88, 90 are open. In the selected module 12, the current in the cells 16 of the connected battery module 10 is regulated very accurately with the aid of the power semiconductor element 40 which is now operating in the linear mode in the first half-bridge 32 or with the aid of the power semiconductor element 42 which is operating in the linear mode in the second half-bridge 34. This is possible since the discharging current needed to determine the Coulombic efficiency is very small in comparison with the current flowing during normal operation. Therefore, the losses in the corresponding power semiconductor element 40, 42 also remain small. Alternatively, if the resistor 78 is not present or is not used, the discharging can be carried out via the consumer 30, that is to say the electrical machine M for instance. For this purpose, the switching module 12 connected to the battery module 10 to be discharged is changed to the discharging mode and the remaining modules 12 in the same current path 24 are changed to the bypass mode. The contactors 54 and 56 (alternatively also additionally 58) are then closed and the modules 12 in the other current paths 26, 28 through which current flows are changed to the bypass mode. The consumer 30 is therefore used as the load and the return current flows through the current path or through the other current paths 26, 28. As previously, all power semiconductor elements 40, 42 in the circuit, that is to say also the power semiconductor element 40 of the first half-bridge 32 and the power semiconductor element 42 of the second half-bridge 34 again, can operate in the linear mode and can regulate the load current. There is usually no need to brake the electrical machine M since the currents needed to carry out the method according to the disclosure are very small in comparison with the rated current of the electrical machine.

After the cells 16 of the battery module connected to the selected module 12 have been discharged to the desired extent, the battery cells 16 are charged again (block 130). There are two embodiments for this, depending on whether a) an external charger is connected or b) is not connected.

a) The positive pole of the charger is connected to the connection 86 and the negative pole is connected to the connection 62. The contactors 60 and 80 are then closed and the contactors 70, 72, 74, 82, 84 are opened. The modules 12 of the circuit arrangement 18 are operated in such a manner that the desired battery module 10 is charged. The charging current is provided with the necessary precision by the charger or is alternatively regulated by the linear mode of one of the current-carrying power semiconductor elements 40, 42 in other modules 12. The current is again measured with the necessary precision using the current sensors installed in the module 12 or using the external sensor 92. The charging current and the discharging current are preferably selected to be the same.

b) Even if the battery is not being charged (that is to say the corresponding vehicle is not parked at a charging station for example), the corresponding battery module 10 can be charged, to be precise by means of the other battery modules 10 in the same current path or in another current path 24, 26, 28. For this purpose, the battery module 10 to be charged is switched to the charging mode (FIG. 1), a certain number of the other battery modules 10 (at least more than one) is switched to the discharging mode (FIG. 3) and the unused battery modules 10 are changed to the bypass mode respectively adapted to the current direction. The circuit is closed either via the resistor 78 (disadvantage: additional losses) or the connected consumer 30 (only two of the three main contactors 48, 50, 52 turn on). There is usually no need to brake the electrical machine M as the consumer 30 since the currents needed to carry out the method are very small in comparison with the rated current of the electrical machine M. It is likewise possible to switch on all three main contactors 48, 50, 52. It is then necessary to respectively operate one of the power semiconductor elements 40, 42, through which current flows, in the linear mode in the two current paths 26, 28 which are intended to provide charging energy and to configure the current regulation in such a manner that the sum of the currents from the two current paths, which are intended to provide energy, corresponds to the desired charging current. The contactors 70, 72, 74 can alternatively be used. If two of said contactors are closed, two phases are again connected in parallel and any desired charging or discharging of battery modules 10 is possible. The current is again regulated by power semiconductor elements 40, 42 in the linear mode, for example by a power semiconductor element 40, 42 of the other switching modules 12 from this current path 24 when charging the selected module 10 (in the bottom left of the unit). In a similar manner to the procedure described above, all three contactors 70, 72, 74 can also be closed in this case when using the electrical machine M.

The described mechanism can also be used for charge equalization (balancing) between different charged battery modules 10 by using battery modules 10 with a higher voltage as the source in order to charge battery modules 10 with a lower voltage.

With the aid of the accurate current regulation or current measurement described, the charge supplied to or taken from the battery modules 10 can be determined very accurately by means of simple integration over time (block 140). The SOC of the battery modules 10 can likewise be accurately determined with the aid of the accurate voltage measurement which is usually present anyway. The prerequisites for determining the Coulombic efficiency (block 150) are therefore satisfied.

The invention claimed is:

1. A method for determining a Coulombic efficiency of a plurality of battery modules of a rechargeable battery with a circuit arrangement connected to the plurality of battery modules, the circuit arrangement having a plurality of current paths, each current path having a plurality of switching modules connected in series between two output terminals that provide an output voltage, each switching module having a first terminal and a second terminal and being connected to a respective battery module in the plurality of battery modules, each switching module being configured to (i) selectively connect the respective connected battery module into a respective current path by connecting the respective connected battery module between the respective first and second terminals and (ii) selectively remove the respective connected battery module from the respective current path by connecting the respective first and second terminals to each other, the method comprising:

selecting at least one battery module of the plurality of battery modules;

operating the plurality of switching modules of a respective current path of the plurality of current paths to (i) connect the selected at least one battery module into the respective current path by connecting the selected at least one battery module being between the respective first and second terminals of the respective switching module and (ii) remove each other battery module of the respective current path from the respective current path by connecting the respective first and second terminals of each other switching module to each other;

subjecting, while the selected at least one battery module is connected in the respective current path and each other battery module of the respective current path is removed from the respective current path, the selected at least one battery module to (i) at least one discharging process and (ii) at least one charging process via the respective current path;

operating at least one power semiconductor of at least one switching module in the respective current path in a linear mode to conduct and regulate a charge current for the at least one charging process and a discharge current for the at least one discharging process;

determining charge quantities by integrating the charge current over a duration of the at least one charging process and integrating the discharge current over a duration of the at least one discharging process; and determining a Coulombic efficiency of the selected at least one battery module based on the determined charge quantities.

2. The method as claimed in claim 1, wherein each of the switching modules has a bridge circuit arrangement with two half-bridges, two power semiconductor elements which act as semiconductor current valves and two freewheeling diodes being connected in each of the half-bridges.

3. The method as claimed in claim 2, wherein each of the two power semiconductor elements acting as semiconductor current valves is connected in parallel with one of the two freewheeling diodes in each of the half-bridges.

4. The method as claimed in claim 1, further comprising:
discharging, during the discharging process, the selected at least one battery module via an external electrical component connected to the circuit arrangement.

5. The method as claimed in claim 1, further comprising:
discharging, during the discharging process, the selected at least one battery module via a connectable load resistor of the circuit arrangement.

6. The method as claimed in claim 5, further comprising:
connecting, during the discharging process, the connectable load resistor with a controllable contactor.

7. The method as claimed in claim 1, further comprising:
charging, during the charging process, the selected at least one battery module via a charger connected to the respective current path.

8. The method as claimed in claim 1, the determining of the Coulombic efficiency comprising:
determining the Coulombic efficiency of the selected at least one battery module based on a ratio of the determined charge quantities.

* * * * *